US008358231B2

(12) United States Patent
Killat et al.

(10) Patent No.: US 8,358,231 B2
(45) Date of Patent: Jan. 22, 2013

(54) TRACKING ANALOG-TO-DIGITAL CONVERTER (ADC) WITH A SELF-CONTROLLED VARIABLE CLOCK

(75) Inventors: Dirk Killat, Cottbus (DE); Huang Yan, Cottbus (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 86 days.

(21) Appl. No.: 13/068,435

(22) Filed: May 11, 2011

(65) Prior Publication Data
US 2012/0212356 A1 Aug. 23, 2012

(30) Foreign Application Priority Data

Feb. 21, 2011 (EP) ..................................... 11155272

(51) Int. Cl.
*H03M 1/34* (2006.01)
(52) U.S. Cl. ........................................ 341/165; 341/166
(58) Field of Classification Search .................. 341/165, 341/166, 172, 163, 155, 156, 136, 162, 159
See application file for complete search history.

(56) References Cited

U.S. PATENT DOCUMENTS

| 6,850,180 | B2 * | 2/2005 | Hales ............................ 341/162 |
| 2010/0127908 | A1 | 5/2010 | Carreau et al. | |
| 2010/0141499 | A1 | 6/2010 | Mathe | |

FOREIGN PATENT DOCUMENTS

| EP | 0158841 | 10/1985 |
| GB | 2 101 435 | 1/1983 |
| WO | WO 2008/117134 | 10/2008 |

OTHER PUBLICATIONS

European Search Report—111552725-1233, Mail date—Sep. 5, 2011, Dialog Semiconductor GmbH.
"A Very Small Sub-Binary Radix DAC for Static Pseudo-Analog High-Precision Memory," by William G. Bliss et al., IEEE 1992, 0-7803-0510-8/92, pp. 425-428.
"High-Precision DAC Based on a Self-Calibrated Sub-Binary Radix Converter," by M. Pastre et al., ISCAS 2004, I-341 to I-344, 0-7803-8251-X/04, 2004 IEEE.
"A 6-Bit 130-MS/s Low-power Tracking ADC in 90 nm CMOS," by Mohamed O. Shaker et al., 2010 IEEE, pp. 304-307, 978-1-4244-7773-9/10.
Analog to-Digital and Digital-to-Analog Conversion Techniques, Second Edition, by David F. Hoeschele, Jr., John Wiley & Sons, New York, (c) 1994, pp. 42-51, ISBN 0-471-57147-4.

* cited by examiner

*Primary Examiner* — Joseph Lauture
(74) *Attorney, Agent, or Firm* — Saile Ackerman LLC; Stephen B. Ackerman

(57) ABSTRACT

A tracking analog-to-digital converter "ADC" with a self-controlled variable clock comprises: a digital register; a digital-to-analog converter "DAC" coupled to said digital register providing an analog feedback signal; a comparator coupled to an analog input signal and said analog feedback signal and providing a comparison signal based on a comparison between said analog input signal and said analog feedback signal, said comparison signal being coupled to the digital register; a means for determining comparator readiness to determine if said comparator is ready, indicating that said comparison signal can be reliably read, said means for determining comparator readiness further comprising a determination of a comparison ready indicator; a means for clocking to generate a clock signal to drive said digital register in response to said means for determining comparator readiness determining that said comparator is ready; and said digital register being configured to count in response to said clock signal based on said comparison signal of the comparator.

31 Claims, 6 Drawing Sheets

Circuit diagram of a tracking ADC with multiple comparators operating in interleaved mode

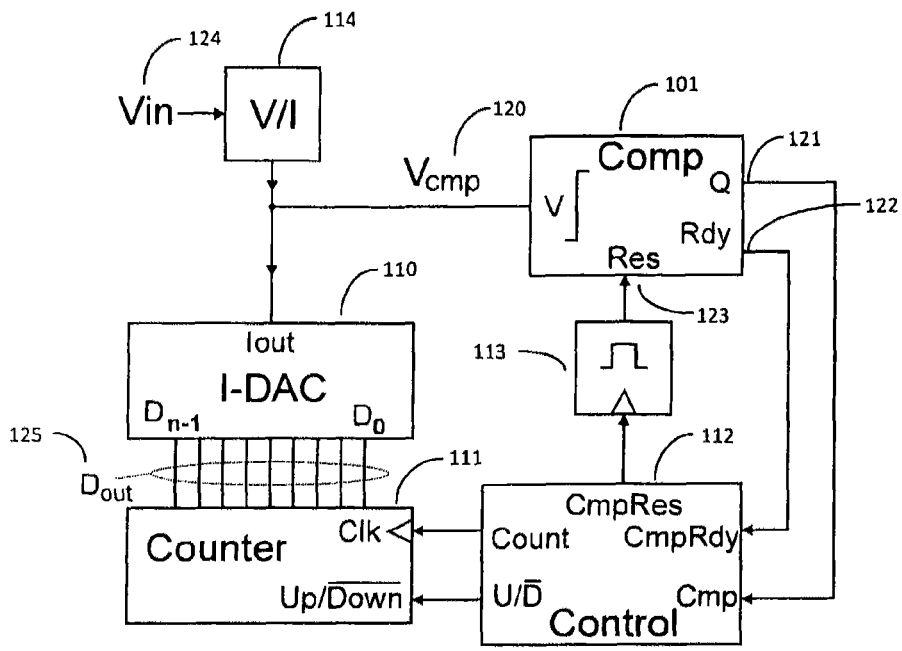
FIG. 1: Circuit diagram of a tracking ADC with a self-controlled variable clock
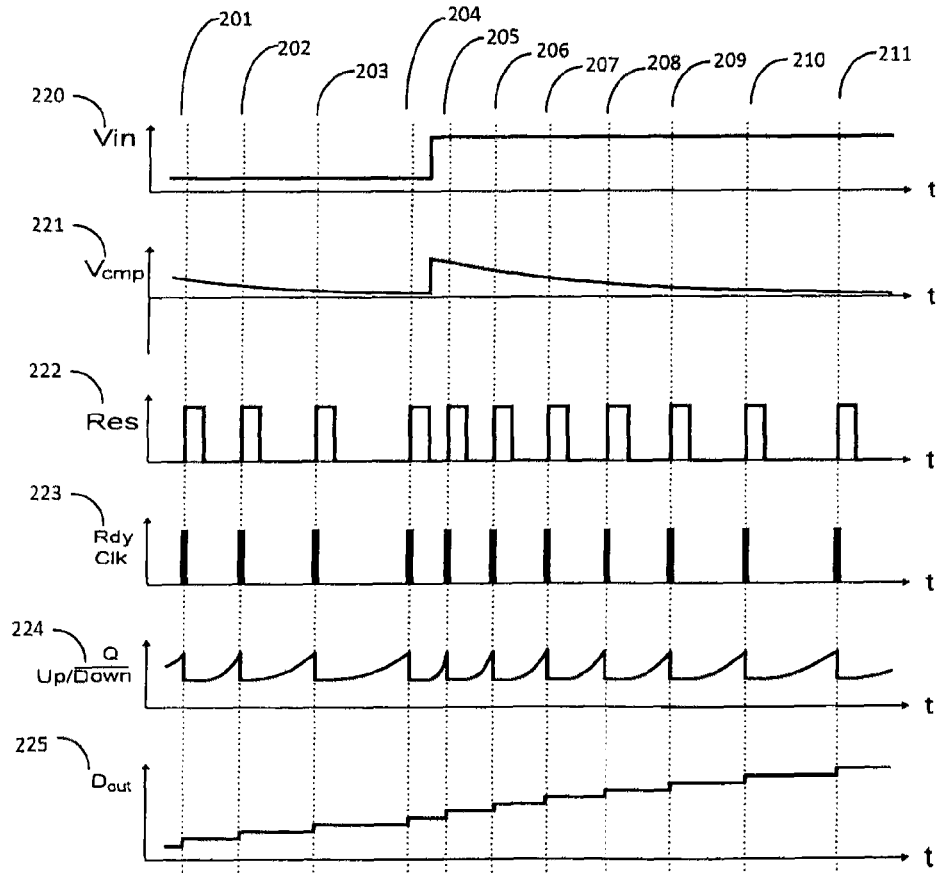
FIG. 2: Timing diagram for the tracking ADC of FIG. 1

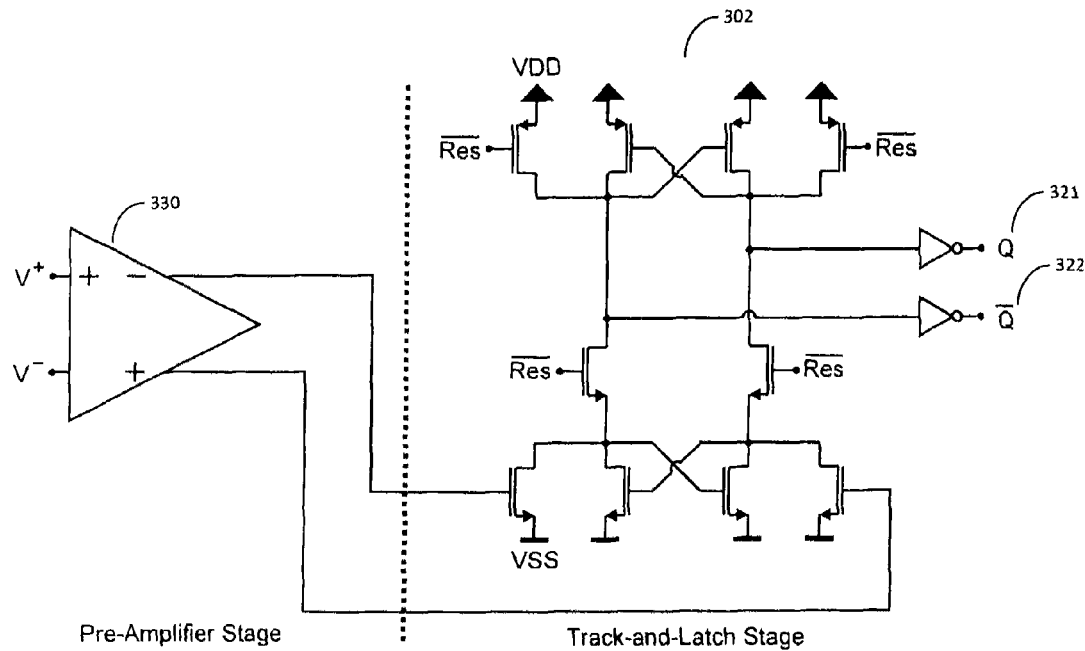
FIG. 3: Circuit diagram of a possible realization of the track-and-latch stage associated with the comparator of FIG. 1
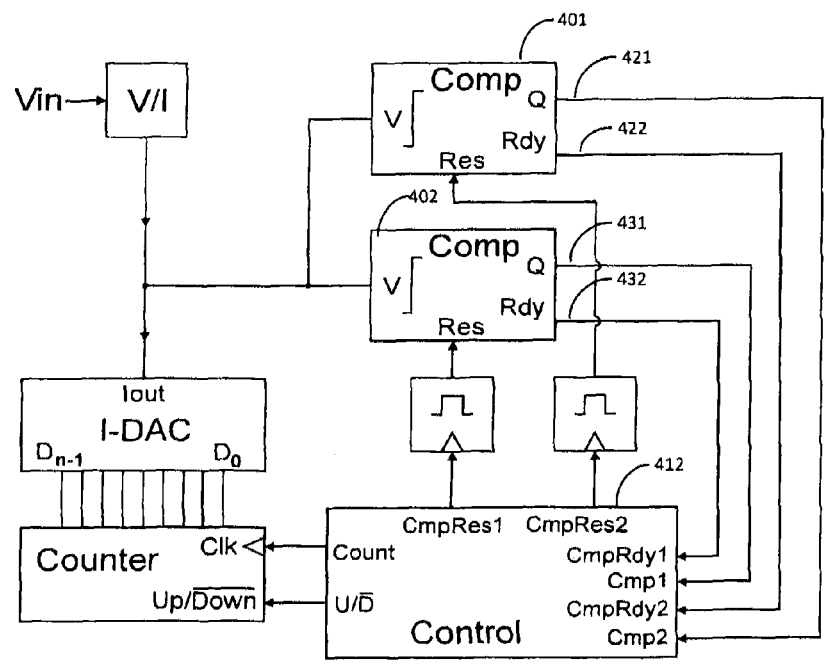
FIG. 4: Circuit diagram of a tracking ADC with multiple comparators operating in interleaved mode

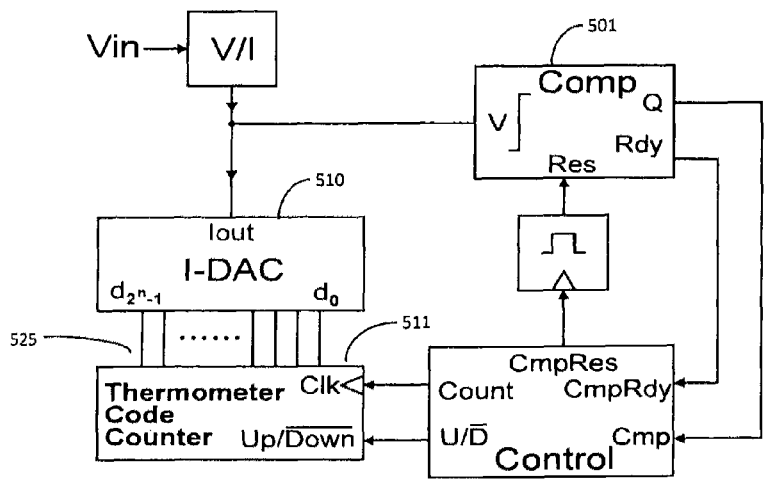
FIG. 5: Circuit diagram of a tracking ADC with a thermometer coded counter register
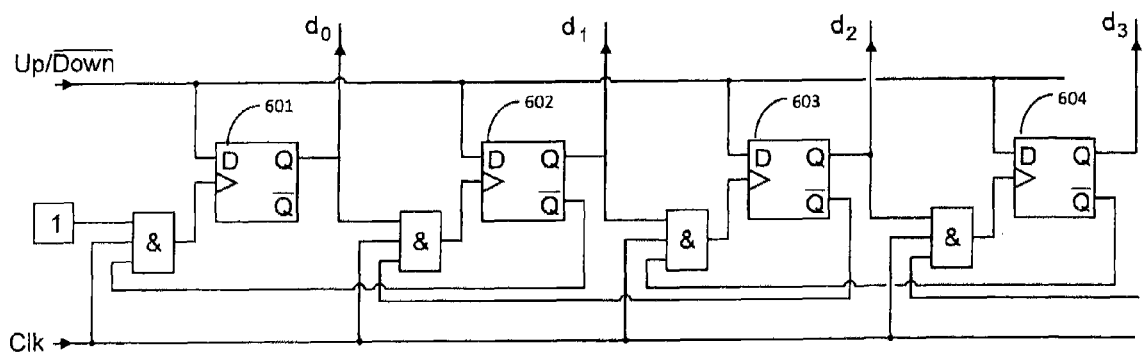
FIG. 6: Circuit diagram of a possible realization of the thermometer coded counter register of FIG. 5

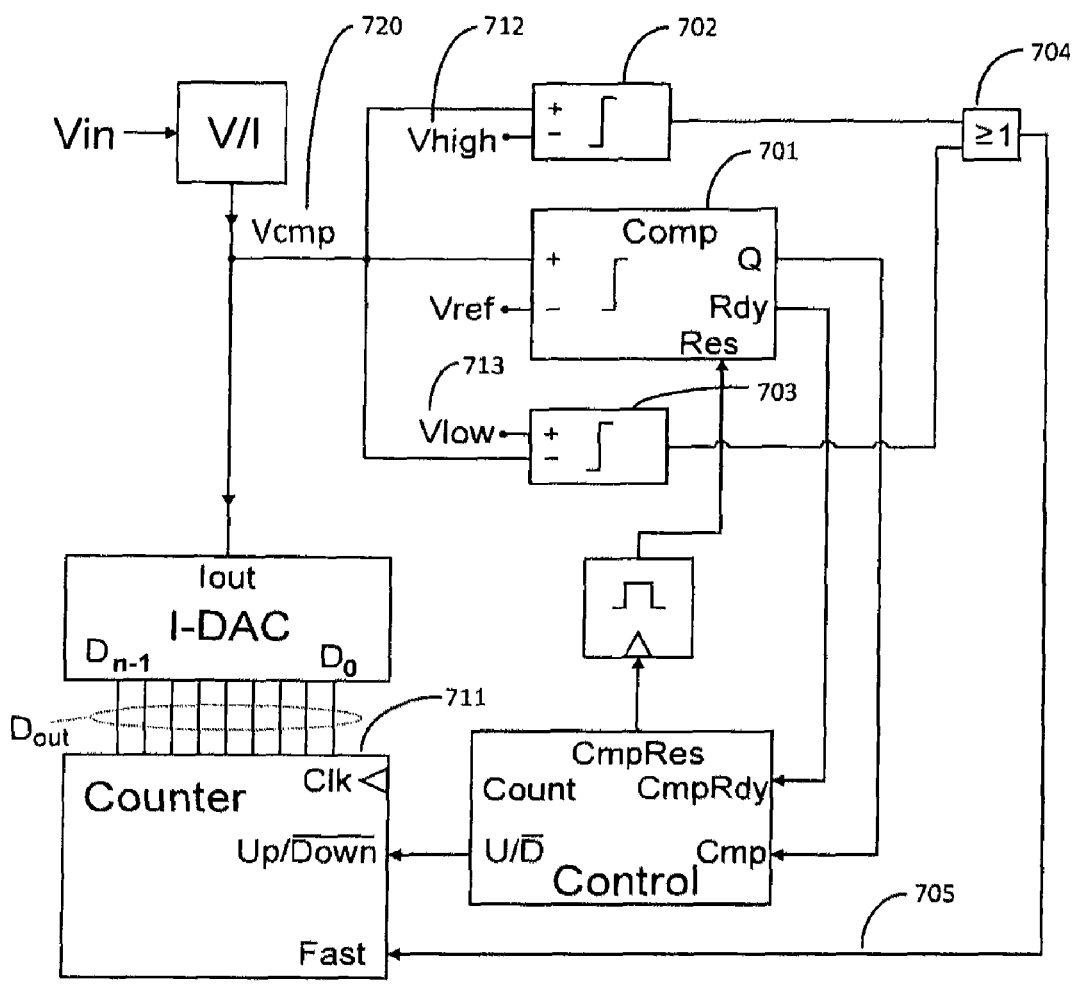
FIG. 7: Circuit diagram of a tracking ADC with fast tracking mode

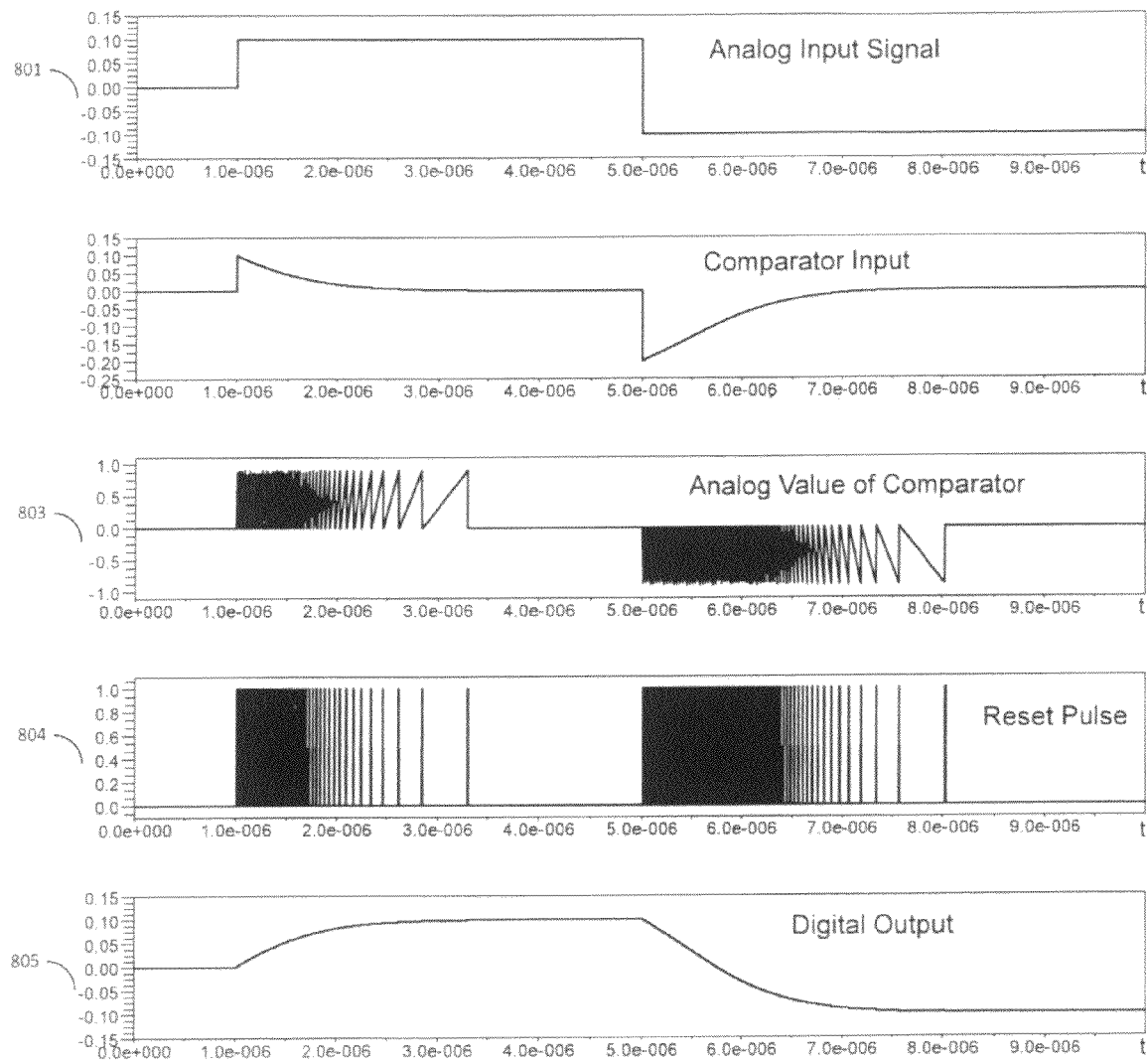
FIG. 8: Timing diagram for a circuit simulation of the tracking ADC of FIG. 1, where the input signal is a square wave

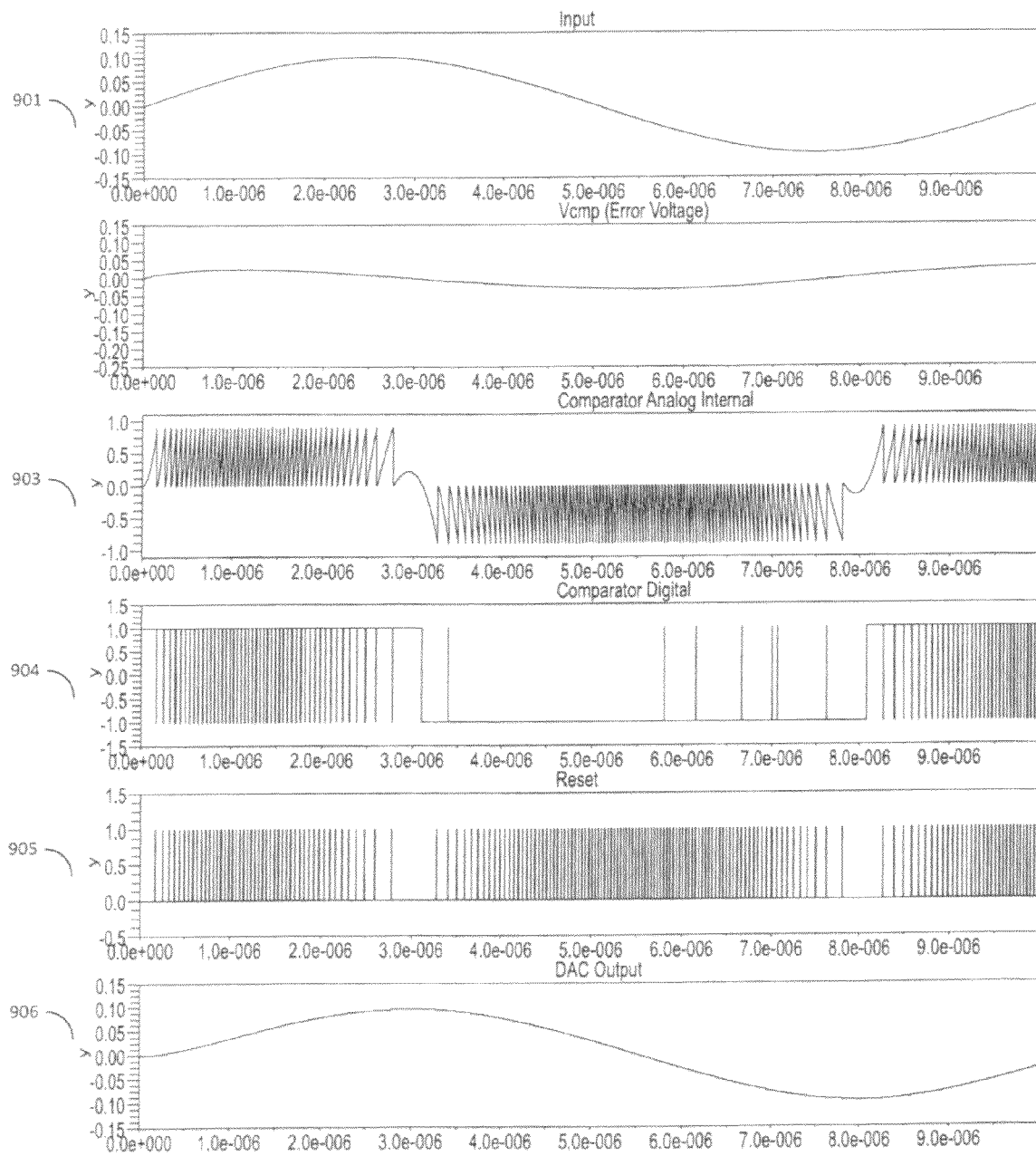
FIG. 9: Timing diagram for a circuit simulation for the tracking ADC of FIG. 1, where the input signal is a sinusoidal wave

TRACKING ANALOG-TO-DIGITAL CONVERTER (ADC) WITH A SELF-CONTROLLED VARIABLE CLOCK

BACKGROUND OF THE INVENTION (1) Field of the Invention

This invention relates to conversion of analog signals to digital signals. In particular, it relates to a tracking analog-to-digital converter (ADC) providing analog-to-digital conversion.

(2) Description of the Prior Art

In the computer and information age, digital technology continues to increase in importance. With advances in technology, more and more everyday devices now incorporate digital technology and operate with digital signals. However, many of the real signals that are controlled, sampled and measured by digital systems exist not as digital signals but as analog signals, which must first be converted from analog to digital form before they can be incorporated into a digital system. Thus, an important device in the implementation of both digital and analog systems is the analog-to-digital converter (ADC or A/D converter), which is a device that converts an analog input signal into a digital number proportional to the input signal.

As many digital systems require an analog-to-digital conversion stage, for example digital audio or digital power supply applications, there is an ever-increasing need for improvement of such ADCs. Furthermore, as the clocking rate of such systems also continues to increase, there is a particular need for ADC devices with an improved ability to quickly and reliably convert analog signals into a digital form for such high-speed digital systems; i.e. there is a need to increase the clock rate and reduce response time of ADCs.

Additionally, in the interest of both production and operational costs, there is a further need for ADC device designs that allow for quick and efficient analog-to-digital conversion with high accuracy and high speed while operating under low power and without complex hardware. The design of a device that achieves all these competing goals in combination makes the design of such a device challenging.

In general, an ADC may be based on many different forms of analog measurement and may convert the analog signal based on different quantities such as voltages, currents or charges. Furthermore, there are many different types of A/D converters.

A tracking-ADC, which may also be referred to as a delta encoded ADC, is based upon a comparison of an analog input with its digital-to-analog (D/A) converted digital output. Generally, a tracking-ADC performs an incremental approximation in steps of one LSB (least significant bit). Thus, the time required by a tracking ADC to follow an input signal varies in relation to the magnitude of change of the respective input signal; thus, the name "tracking", as the tracking ADC tracks the signal. The worst-case time for tracking its input occurs when the input signal changes by the maximum value, which then requires LSB stepping over the full input range (full scale). In such a case, the tracking-ADC requires $2^N-1$ steps to follow the input, where N is the total number of binary coded bits in the digital-converted output.

The tracking ADC offers the advantage of robustness against missing codes and monotony errors. Furthermore, the digital conversion of the tracking ADC can "follow" the input signal for small input signal changes on the order of an LSB with a single step, meaning that the tracking ADC has a fast response time for small input changes. However, the design characteristics of the associated comparator concerning speed and accuracy are most significant for the detection of such small input changes. More significantly, for large changes of the input signal, the tracking ADC requires several LSB steps to follow the input signal. This time needed to track a large change in the input signal is known as slewing time and can require up to a maximum of $2^N-1$ steps. More precisely, slewing can be considered to be the time that the ADC output requires to converge to its input via feedback.

As large changes in the input signal require a large number of conversion steps to track the input signal, there is a desire to reduce the conversion time required for each step in order to reduce the cumulative time. Generally, the limiting characteristic on which the possible reduction of the conversion step time of a tracking-ADC is dependent on is the time that the comparator needs to compare the input signal with the D/A-converted analog feedback signal. This time is known as the settling time of the comparator. Thus, if the ADC is clocked by a periodic clock signal, the minimum clock period is generally limited by the maximum settling time of the comparator. Typically, such ADCs are driven by a fixed clock and are thus called synchronous ADCs.

There is a need for an analog-to-digital converter that provides fast conversion times, has low energy consumption and has a low error rate so as not to require additional complex hardware for error correction.

SUMMARY

The settling time that a comparator requires to compare the signals is not constant. Rather, the comparator settling time varies greatly depending on the difference between the input and the feedback signal, where the settling time is at its maximum when the difference between the input signal and the D/A-converted feedback signal from the digital register is at its minimum. This maximum settling time corresponds to small input differences on the order of one LSB. In contrast, the settling time when the difference is large is substantially shorter. Thus, the settling time is relatively short when the input signal changes significantly in magnitude, and the settling time is relatively long when the signal changes are small.

The tracking ADC described in this application is based on this characteristic by configuring the device to take advantage of the fact that the settling time of the comparator is relatively short when the difference between the input signal and the D/A converted output feedback signal is large, which also corresponds to the conditions under which slewing occurs. Thus, the tracking ADC described in this application solves the above problems by providing a tracking ADC that can be driven with a self-controlled variable clock based on a determination of the settling time of the comparator. Therefore, the maximum clock rate of this design is primarily limited by the settling time of comparator, allowing the clock rate to be substantially increased in response to large input changes, further allowing the slewing time to be thereby greatly reduced.

Thus, the tracking ADC described in this application provides shorter tracking times in response to large input changes such as a step in the input. Additionally, this possibility to increase the clock rate allows the tracking ADC to better operate with a self-controlled variable clock to provide high speed analog-to-digital conversion by reducing slewing, thereby allowing for fast tracking of large input changes. The proposed tracking ADC further has a low error rate and low power requirements without requiring complex additional correction hardware.

In particular, the primary disadvantage of tracking ADCs relating to the slewing of the digital output at large input signal steps can be improved by dynamically increasing the clock rate during the time period when the digital output is slewing. In other words, the use of a self-controlled variable clock makes it possible to speed up the tracking time when the difference between the input and tracking or feedback signal is large. Of significance is that the conditions related to slewing also correspond to the conditions when the settling time of the comparator is short. Thus, the tracking ADC described in this application makes it possible to take advantage of this condition where the settling time is short by dynamically increasing the clock speed, which in turn reduces slewing.

When the tracking ADC is clocked with a self-controlled variable clock, the clock rate is typically limited by the settling time of the comparator and the settling time of the feedback DAC as well as some additional time for the digital control logic. In contrast, for a tracking ADC with a fixed clock, the clock rate must be set to allow for the maximum settling time of the comparator. As described further above, heavy slewing may require up to a maximum of $2^N-1$ steps for the ADC output to converge to its input via feedback. Thus, particularly during heavy slewing, where although the settling time of the comparator is very short, the use of a fixed rate clock that must take the maximum settling time into account makes it difficult for the ADC to track large input changes quickly.

Typically, the settling time of the comparator is highly dependent on its gain-bandwidth such that for large differences between the input signal and the DAC feedback signal, the settling time of the comparator is very short. As described above, the short comparator settling time corresponds with a shorter slewing time of its digital output. Thus, the ADC can be designed to take advantage of this correspondence between the short settling time and the high slew rate in order to increase the clock rate during ADC slewing by clocking the ADC with a self-controlled variable clock based on the settling time of the comparator. In this respect, the settling time can be alternately expressed as the comparator readiness. Thus, the device can quantify the time required for transient settling of the comparator through the use of an indication of the comparator readiness based on whether the comparator is ready. The satisfying of the condition of the comparator being ready indicates that the output of the comparator, the comparison signal, can be reliably read. For example, the comparator is not ready during the time following a comparator reset or a change to the feedback signal, as the recent change must first propagate through the comparator. Furthermore, the comparator output signal may still reflect the comparison with the old value of the feedback signal rather than the comparison with the updated value of the feedback signal. Thus, during the time that the comparator is determined to not be ready, the output of the comparator is not reliable and generally should not be read (unless special hold or latch output elements are used). When the comparator is determined to be ready, then the comparator output signals may be read.

In accordance with an aspect of the invention, a tracking analog-to-digital converter "ADC" with a self-controlled variable clock is provided comprising a digital register, a digital-to-analog converter "DAC" and a comparator. The DAC is coupled to the digital register and provides an analog feedback signal. The comparator provides a comparison signal based on a comparison between an analog input signal and the analog feedback signal. The comparison signal is further coupled to the digital register. A control block may also be coupled to the digital register to control the digital register based on the comparison signal. The ADC further comprises a means for determining a comparison ready indicator based on a determination of comparator readiness, indicating the comparator is ready, further indicating that the comparison signal can be reliably read. The ADC also comprises a means for clocking to generate a clock signal to control the digital register in response to at least the comparison ready indicator indicating the comparator is ready. The digital register is further configured to increase or decrease a value of the digital register in response to the clock signal based on the comparison signal of the comparator.

In accordance with this aspect of the invention, a method is also provided to clock a tracking analog-to-digital converter "ADC" with a self-controlled variable clock, where the method comprises receiving an analog input signal. The method further comprises obtaining a digital signal from a digital register representing the digital output, and obtaining an analog feedback signal from a digital-to-analog converter "DAC" based on the digital counter signal. The method further comprises comparing, by a comparator, the analog input signal with the analog feedback signal to determine a comparison signal, indicating whether the analog input signal is larger or smaller than the analog feedback signal. The method further comprises determining a comparison ready indicator for the comparator based on a determination of whether the comparator has settled, indicating whether the comparison signal of the comparator can be reliably read. Then, in response to a change in the comparison ready indicator indicating that the comparator has settled and the comparison signal of the comparator can be reliably read, the method further comprises increasing respectively decreasing the digital register based on the comparison signal and the comparison ready indicator from the comparator.

As the settling time of the comparator is a significant factor on which the clock rate is dependent, a further aspect of the invention provides features to allow the tracking ADC to more easily and accurately detect that the comparator has settled. Thus, in accordance with a further aspect of the invention, a tracking ADC with a self-controlled variable clock is provided wherein the means for determining comparator readiness comprises a determining of the comparison ready indicator based on a state of readiness of the comparator. Thus, the comparator is determined to be ready when the comparator has settled.

In accordance with this aspect of the invention, a method further provides the step of causing the comparison ready indicator of the comparator to be reset in response to a change in the comparison ready indicator, indicating that the comparator has settled and the comparison signal of the comparator can be reliably read.

When the tracking ADC is clocked with a self-controlled variable clock, the clock rate is typically limited by the settling time of the comparator and the settling time of the feedback DAC as well as some additional time for the digital control logic. In addition, the time necessary to reset the comparator may also limit the maximum clock rate. This time to reset the comparator may be referred to as the reset time. In particular, if the next clock cycle begins before internal signals and the outputs of the comparator have time to be properly reset, transient output signals may be produced or an output signal even may be missed entirely. Furthermore, insufficient reset time may result in incomplete reset of the voltages of the latch stage, resulting in hysteresis of the comparator. The reset time is generally independent of the settling time. As the reset time of a comparator is generally relatively constant, the reset time generally refers to the minimum time required to reset the comparator sufficiently for normal operation. Thus, the maximum clock rate of the self-controlled variable clock should also allow for sufficient reset time of the comparator.

The ADC may further comprise a means for resetting the comparator to reset the comparator and subsequently cause the comparison ready indicator of the comparator to be reset. This means for triggering the reset of the comparator is dependent on the comparison ready indicator and an optional control signal, where the control signal provides an indication that the comparison signal is no longer needed. For example, the control signal could be configured to ensure that the counter has read the comparison signal before the comparator is reset.

In accordance with this aspect of the invention, a method is also provided to send a pulse to a reset input of the comparator to cause the comparator to reset, causing the comparison ready indicator of the comparator to be reset in response to a change in the comparison ready indicator indicating that the comparator has settled and the comparison signal of the comparator can be reliably read.

The ADC may further comprise a control block coupled to the comparator and the digital register, where the control block is configured to generate signals to drive the digital register at least based on the comparison ready indicator and the comparison signal.

When the tracking ADC is clocked with a self-controlled variable clock, and the clock rate speeded up by detecting the settling time of the comparator as described above, this speedup is most significant during heavy slewing. Thus, with a tracking ADC is clocked with a self-controlled variable clock under heavy slewing, the maximum clock rate may be primarily limited by the settling time of the feedback DAC and the time for the digital control logic. For example, during heavy slewing when the settling time of the comparator is very short, the slewing of the thermometer coded DAC and the delay of the logic may become dominant.

The ADC may further comprise a means for delaying based on a determination of a comparator settling time, the means for determining comparator readiness, a determination of a settling time of the DAC and/or a maximum clock rate of the digital register. This means for delaying may further comprise a means for delaying the clock signal for the digital register, a means for delaying the start of a reset pulse generated by the means for resetting the comparator, or a means for delaying or extending the duration of a reset pulse generated by the means for resetting the comparator.

In accordance with this aspect of the invention, a method is also provided to delay the step of counting the digital register based on a determination of a settling time of the digital register, a determination of a settling time of the DAC and/or the maximum clock rate of the digital register.

The digital register of the ADC may further comprise an up-down counter. The inputs of the counter may further comprise an up/down input selector and a clock input signal, where the up/down input selector indicates whether the digital register should increment or decrement its value based on the comparison signal. The clock input signal of the counter is coupled to the means for clocking.

In accordance with this aspect of the invention, a method step of causing the counter to count may further comprise incrementing or decrementing the up-down counter based on the comparison signal, where the digital register comprises an up-down counter comprising an up/down input.

The comparator of the ADC may further comprise a latch output stage configured to generate a comparison output signal and an inverted comparison output signal. Furthermore, the means for determining comparator readiness may further be configured to generate the comparison ready indicator based on the latched comparison signals. For example, the comparison ready indicator may be determined from the latched comparison signals as an XOR catenation of the inverted and the non-inverted latched comparison signals of the comparator.

In accordance with this aspect of the invention, a method is also provided for determining the comparison ready indicator from a latch output stage of the comparator comprising a latched comparison signal and an inverted latched comparison signal. This determination may be made from an XOR catenation of the inverted and the non-inverted latched comparison signals of the comparator. Alternately, the comparison ready signal indicator could be derived from the internal analog signal of the output stage of the comparator. For example, the comparison ready indicator could be derived from the currents flowing in the latched output stage.

The ADC may further comprise a control component coupled to the analog signals and the comparator. The control component may be further configured to provide conditioning of the analog signals via frequency filtering or FIR-filtering to reduce monotonic error and/or provide feedback stabilization.

In accordance with this aspect of the invention, a method is also provided to control or condition the analog input signal provided as input to the comparator to reduce monotonic error and/or provide feedback stabilization. This conditioning may be achieved, for example through frequency filtering or addition of a pole to the feedback loop.

In order to prevent the occurrence of wrong values during incrementing or decrementing of the digital register, it is beneficial to reduce the number of bits that change in response to normal counting in single steps of one LSB. Thus, the digital register of the ADC may be further configured to update an output value of the digital register by modifying only a single bit of output value of the digital register in response to an increment or decrement step of one LSB of the value of the digital register.

Likewise, it is beneficial for the output value produced by the DAC to not produce any wrong values during incrementing or decrementing of the digital register in response to normal counting in single steps of one LSB. Thus, the DAC of the ADC may be further configured to produce a monotone change in the analog feedback signal in response to any increment or decrement step of one LSB of the output value of the digital register.

The means for determining comparator readiness may further comprise determining the comparison indicator signal based on sensing of analog signals inside the comparator. For example, the internal state of a latch transistor and a relationship to a transistor threshold can be used to determine the comparison indicator signal.

The digital register may be further configured to update an output value of the digital register in response to an increment or decrement step by modifying the value of the digital register by setting one or more bits without clearing any bits for each increment step and clearing one or more bits without setting any bits for each decrement step. Alternately, in inverted mode, the setting and clearing are inversed, so that the value is updated by clearing one or more bits without setting any bits for each increment step and setting one or more bits without clearing any bits for each decrement step. In particular, this feature of only setting or clearing for increments and decrements, respectively, may be combined with the modifying of only a single bit of output value for steps of one LSB, as described above.

The DAC may be further configured to produce a monotone change in the analog feedback signal also during its time of settling in response to any increment or decrement steps. However, monotonous output is most important for step changes of one single LSB.

The digital register may further comprise a plurality of digital storage elements and the DAC may further comprise a plurality of D/A conversion elements, where each storage element is configured to control one conversion element of the DAC. Thus, each storage element controls a single conversion element, typically in a one-to-one relationship. Each element of the DAC can have equal weight, called unit elements, or non-equal weights.

The digital register and the DAC may be further configured such that the digital register comprises a plurality of storage elements, each storage element being configured to control at least one conversion element of the DAC, so that any change in an output signal level of any one of the plurality of storage elements from "low" to "high" induces a direct change in the DAC output value by adding a value of an associated conversion element of the DAC in one and the same direction. Vice versa, any change in an output signal level of any one of the plurality of storage elements from "high" to "low" induces a direct change in the DAC output value by removing a value of an associated conversion element of the DAC in the opposite direction. Thus, any change to a storage element of the digital register in a particular direction, e.g. "high" to "low" or "low" to "high", always results in either an increase or decrease, and any change in the opposite direction, e.g. "high" to "low" instead of "low" to "high", or "low" to "high" instead of "high" to "low", results in an opposite increase or decrease, respectively. In other words, in a specific instance, a "high" to "low" is always associated with an increase, and a "low" to "high" is always associated with a decrease.

Alternatively, the digital register and the DAC may be further configured such that the digital register comprises a plurality of storage elements and each storage element is configured to control at least one conversion element of the DAC, so that any change in an output signal level of any one of the plurality of storage elements from "low" to "high" induces a direct change in the DAC output value representing physical value in one and the same direction. Vice versa, any change in an output signal level of any one of the plurality of storage elements from "high" to "low" induces a direct change in the DAC output value representing physical value in the opposite direction. In this respect, the physical representation of the DAC output value could be a voltage, a current or a charge. In other words, if the digital register and the DAC are configured to increase the output value of the DAC when an element of the digital register changes from "low" to "high", then the DAC should be configured to decrease the output value of the DAC when an element of the digital register changes from "high" to "low".

For instance, the digital register of the ADC may comprise a thermometer coded counter register. Alternatively, the digital register of the ADC may also or comprise a Gray coded counter.

The comparator of the ADC may comprise a current comparator, a voltage comparator or a charge comparator. In accordance with this aspect of the invention, the step of comparing by a comparator may comprise comparing currents, comparing voltages or comparing charges.

The ADC may be further configured to increase the tracking speed by employing additional comparators in interleaved mode. In interleaved mode, the ADC may further comprise one or more additional comparators operating in interleaved mode, each coupled to the analog input signal and the analog feedback signal and each providing comparison signals based on a comparison between the analog input signal and the analog feedback signal. The one or more comparison signals of each additional comparator are coupled to inputs of the control block. Furthermore, the ADC may comprise an additional means for determining comparator readiness for each of the one or more additional comparators, to determine if the respective additional comparator is ready, indicating the respective comparison signal can be reliably read. The ADC may further comprise an additional means for selecting a comparator to alternately select one of the comparators from the plurality of comparators to be used for the means for clocking to drive the digital register.

In accordance with this aspect of the invention, a method is also provided to further increase the clock rate of the ADC by employing a plurality of comparators. The method further comprises a step to alternately select a comparison signal of one of the comparators to allow the other comparators time to settle following a comparator reset. The method further includes the step of comparing, by one or more additional comparators, the analog input signal with the analog feedback signal. The next method step comprises determining respective ready comparison signals corresponding to each of the one or more additional comparators, followed by alternately selecting one of the plurality of comparators. The next method step comprises using the selected comparison signal of the selected comparator to drive the digital register followed by the step of causing the selected comparator to be reset causing the corresponding ready comparison signal of the selected comparator to be reset. The means for selecting a comparator from the plurality of interleaved comparators may further comprise control logic to control comparator selection to alternately select a comparator from the plurality of comparators, select the corresponding comparison signal of the selected comparator and reset the selected comparator.

The ADC may be further configured to provide a means for providing a fast-tracking mode to count in either small or large steps. A small step usually comprises one LSB, while a large step can be 2 LSB or more. An even larger magnitude large step will allow the digital register serving as a counter to track even more quickly, although if the large step increment size is made too large, the ADC may overshoot during tracking. Thus, the ADC may further comprise one or more additional comparators each associated with a corresponding difference level signal, where each of the one or more additional comparators is configured to determine a corresponding large difference signal by comparing a difference between the analog input signal and the feedback signal with the corresponding difference level signal associated with each additional comparator. The digital register may then further comprise one or more fast count inputs configured to cause the digital register to count in larger increments or decrements based on conditions where any of the large difference signals of the one or more additional comparators indicate the difference between the analog input signal and the feedback signal is larger than a corresponding difference level signal.

In accordance with this aspect of the invention providing a fast-tracking mode to count in either small or large steps, the method for fast-tracking mode to count in either small or large steps is also provided. The fast-tracking mode method comprises determining a measured difference as a difference between the analog input signals and the feedback signals. The fast-tracking mode method further comprises obtaining a difference level signal for each of one or more additional comparators. The fast-tracking mode method further comprises comparing, by each of the one or more additional comparators, the measured difference with the difference level signal for each corresponding additional comparator. The fast-tracking mode method further comprises determining a corresponding large difference signal for each of the one or more additional comparators by comparing the measured difference with the corresponding difference level signal for each of the one or more additional comparators to determine whether the measured difference is larger than the corresponding difference level signal. The fast-tracking mode method further comprises determining if any of the corresponding large difference signals from the one or more additional comparators indicate that the difference between the analog input signal and the feedback signal that is the D/A converted digital output is larger than any of the corresponding difference level signals. The fast-tracking mode method further comprises counting the digital register in larger steps than one LSB, in response to the determination that the large difference signals indicate a difference larger than the corresponding difference level signal.

In order to ensure stability of the feedback system, it may be necessary to use digital filtering. For example, the ADC may further comprise a means for providing digital signal filtering of the comparison signal or signals. Alternately, the ADC may further comprise a means for adding a dominant pole to the feedback loop comprising the comparator, the control logic, the digital register and the DAC. The ADC may further comprise a means for clocking the ADC based on an external clock in order to synchronize the self-controlled variable clock with the external clock.

The features of the tracking ADCs with self-controlled variable clock described herein provide the improvement that the speed of the tracking ADC is increased significantly. In particular, in response to large input signal changes, such as a step in the input, the tracking ADC attains a significant speed increase.

In particular, the maximum clock rate of the tracking ADC described in this application is primarily limited by reset time and settling time of comparator, which can be further reduced through the appropriate choice of components.

Furthermore, the features of the tracking ADC described herein may be realized with low power consumption. In comparison to other known methods of increasing the ADC response or tracking time, the tracking ADC allows the power consumption to be significantly reduced.

BRIEF DESCRIPTION OF THE DRAWINGS

In the accompanying drawings forming a material part of this description, there is shown:

FIG. 1 shows a circuit diagram of a tracking ADC with a self-controlled variable clock.

FIG. 2 shows the timing diagram for the tracking ADC of FIG. 1.

FIG. 3 shows a circuit diagram of a possible realization of the track-and-latch stage associated with the comparator of FIG. 1.

FIG. 4 shows a circuit diagram of a tracking ADC with multiple comparators operating in interleaved mode.

FIG. 5 shows a circuit diagram of a tracking ADC with a thermometer coded counter register.

FIG. 6 shows a circuit diagram of a possible realization of the thermometer coded counter register of FIG. 5.

FIG. 7 shows a circuit diagram of a tracking ADC with a fast tracking mode.

FIG. 8 shows a detailed timing diagram for a circuit simulation of the tracking ADC of FIG. 1, where the input signal is a square wave.

FIG. 9 shows the timing diagram for the tracking ADC of FIG. 1, where the input signal is a sinusoidal wave.

DESCRIPTION OF THE PREFERRED EMBODIMENTS

In general, an ADC based upon the comparison of the analog input and the D/A-converted output can be operated with currents, voltages or charges. If the comparison is done with currents, a positive and a negative current are added and converted to a voltage by the output impedance of the current sources, where one of the currents is derived from the analog input, and the other current is derived from the D/A-converted digital output. The voltage is then fed to the input of a comparator.

FIG. 1 shows a circuit diagram for a tracking ADC with a self-controlled variable clock according to a preferred embodiment of the present invention. The tracking ADC of FIG. 1 comprises an up-down counter 111, whose output signal is a digital counter signal Dout 125. This digital counter signal Dout 125 is fed into a DAC 110. In FIG. 1 the analog input voltage Vin 124 is converted to a current by component 114 (V/I-Converter, transconductance) and then compared with a current derived from the digital counter value Dout 125 of the counter 111. The current conversion is made with a current steering DAC (I-DAC) 110. A current difference induces a shift of Vcmp 120 that is detected with the comparator 101. It should be clear to a person skilled in the art that the present embodiment represents only one possible example for the comparator 101 and DAC 110, and various forms of comparators based on comparing currents, voltages or charges could also be used in conjunction with the present application. Likewise, the input for the comparators can be based on either single-ended input or differential signals.

For high performance, the comparators in a tracking ADC should have a high gain-bandwidth product (GBW). Furthermore, the comparators should have a positive feedback and be reset periodically. The comparator 101 in FIG. 1 is clocked and operated with two clock phases. The first phase is the comparison or gain phase, and the second phase is the reset phase. For operation of the ADC with a self-controlled variable clock, the comparator in this embodiment has two outputs: one output is the data output Q 121, the other is a ready-signal Rdy 122.

Locally, inside of the ADC, the ready-signal 122 of the comparator forms the rising slope of the internal ADC clock. Globally, this internal ADC clock may be asynchronous or synchronous to an external clock. For example, if the system above the ADC is running on a very high clock, for instance 1 GHz, the control logic of the ADC may be synchronized to this (relatively high) system clock.

The ready signal Rdy 122 provides the comparison ready indicator and identifies that the data output Q 121 is stable and valid. If the comparator has a latch output stage (not shown in FIG. 1), the data output Q 121 may further have both a normal data output (Q) and an inverted signal (Q¬) available. In this case, the ready indicator may be generated in a straightforward manner by the XOR catenation of Q and Q¬ because in the reset phase Q and Q¬ have the same logic level. (In the figures Q¬ is not drawn). FIG. 3 shows a circuit diagram of a possible realization of the track-and-latch stage associated with the comparator of FIG. 1.

Furthermore, the detection of settling of the comparator 101 can be achieved by sensing of analog signals inside of the comparator. For instance, a logic circuit with threshold detection can be used to sense the settling of the comparator. In one particular implementation, the threshold voltage for the comparison is based on half of the supply voltage, or half of VDD, where the logic detection determines comparator settling based on input levels being above or below the threshold. In addition to the normal logic that switches at VDD/2, the logic can also be further configured to delay the data ready indicator when the analog threshold is very near to the logical 0-to-1 or 1-to-0 switching point. For example, if the comparator is normally configured to start switching at a level of 80% to 90% of this switching point, in a reverse feedback path the threshold can be increased by, say 70%, in order to induce a delay in the switching. This delay of the data ready indicator for almost constant or slowly changing values of the data signal Q. Using an asymmetrical switching threshold can help to reduce oscillation by providing a delay without requiring a special delay unit. In other words, when the input signal is almost constant or changing slowly, it is undesirable for the converter to alternately step up and down at a high rate, as such a fast-changing output is not representative of the near-constant input signal. Thus, this detection feature in the comparator can be used to delay the data ready indicator until a significant change is detected. Alternately, it can also be designed to only provide such a delay up to a given amount of time.

Furthermore, it is also possible to configure the comparator to generate the comparison ready indicator by OR or XOR catenation of the inverted and non-inverted latched comparison signals.

The output Q 121 of the comparator 101 controls the up/down input of the counter 111 by means of an asynchronous control logic. Asynchronous means that this logic is not necessarily controlled by an external clock, but the operation of the logic could be synchronous to an external clock that is higher than the clocking of the logic. In example, if the settling time variation of the comparator is between 1 nsec and 1 μsec, the external clock could be 1 GHz and hence the clocking of the control logic of the ADC could be synchronized to this external clock with a grid of 1 nsec. The counter 111 is clocked using the Rdy signal 122 by means of the asynchronous control logic. In the straightforward case, Q 121 and Rdy 122 are simply directly connected with the up/down and Clk inputs of the counter 111. However, the control block 112 may be configured based on other arrangements. For example, in order to not exceed the setup time of the counter 111, the propagation of the signal Rdy 122 into the Clk signal of the counter 111 can be delayed. Thus, the control block 112 may include a delay unit.

Even though it operates with a self-controlled clock, the ADC described in this application could be used in a system with a fixed clock frequency. In such a case, it may be necessary to further configure the ADC to synchronize the self-controlled variable clock with an external clock. It is possible for the external clock to be either faster or slower than the internal range of the self-controlled clock of the ADC. However, such synchronization may further require additional circuit components to properly match the interval timing. For example, D-Lines or Delayed-Locked-Loops (DLLs) with low power consumption could be used to achieve the appropriate matching of the internal timing of the ADC for synchronization with an external clock without requiring a separate high-frequency oscillator.

The output of the counter 111 is represented by the converted digital output Dout 125. The DAC in the specific example in FIG. 1 is a current steering DAC 110. The I-DAC 110 then produces an output current based on Dout 125, the inverse of which is added with the input current in order to produce Vcmp 120.

For repetitive cycling it is necessary to reset the comparator 101 after the counter 111 is clocked with the rising edge of the Rdy signal 123. For example, the control block 112 and the pulse generator 113 can be configured so that in response to the rising edge of the Rdy signal 122 of the comparator 101, a monoflop 113 is triggered generating the reset pulse of the comparator. In the simple case, the Rdy signal 122 triggers the monoflop 113 and clocks the counter 111 simultaneously. However, additional logic can be added to the ADC to further tune the timing of these signals. For example, it may be necessary to delay the reset pulse 123 and ensure that the data signal Q 121 can be read before the comparator 101 is reset. In this respect, the counter 111 may further comprise a ready signal or a data read signal, indicating that the counter inputs have been successfully read and the counter inputs may change without adversely affecting the counter 111.

Comparator 101 is driven with the input voltage Vcmp 120 that is generated based on the analog input current and the analog value of the I-DAC and represents the difference between the input voltage Vin and the feedback value represented by the value stored in the counter 111. If the analog input is subtracted from the D/A converted output signal, for instance by using currents with opposite sign, the comparator inputs are the difference of these two signals and an analog feedback, for instance VDD/2. If the analog input and the D/A converted output are not subtracted, for instance if the analog input and the D/A converted output are voltages, both signals are fed to the two inputs of the comparator directly. The comparison of a single Vcmp to an analog reference may alternately be established via a comparison of Vin and Vdac. In the particular example in FIG. 1, a current is produced based on the input signal Vin 124 and the DAC 110 value such that a current flows from the V/I converter 114 to Iout of the I-DAC 110.

The comparator 101 has a data output Q 121, providing a digital value based on the comparison signal Vcmp 120, which in turn is based on the relationship between the input voltage Vin 124 relative to the feedback value derived from the counter value in the DAC 110. Thus, in this particular example, the data output Q 121 has a high value when the input signal is greater than the feedback signal and a low value when the input signal is less than the feedback signal. During the time following a change in the comparator input Vcmp 120 signal, the comparator data signal Q 121 may be subject to transient conditions and cannot be reliable read. The Rdy output 122 of the comparator 101 provides an indication that the comparator 101 has settled, meaning that the comparator 101 has reached a steady state not dominated by transient conditions and the data output Q 121 can be reliably read.

The ADC of FIG. 1 further comprises a control block 112, which takes the data output Q 121 and the Rdy output 122 of the comparator 101 as inputs. The control block 112 provides output signals for the counter 111 comprising a count signal for the clock and an up/down signal. In the simplest case, the control block 112 uses the data output Q 121 to drive the up/down input of the counter 111. Thus, a high data output Q 121 indicates that the input signal Vin 124 is greater than the feedback value derived from the counter 111, so the up/down input of the counter 111 will be driven with high to cause the counter 111 to count up. Conversely, a low data output Q 121 indicates that the input signal Vin 124 is less than the feedback value derived from the counter 111, so the up/down input of the counter 111 will be driven with low to cause the counter 111 to count down. The control block 112 further provides a CmpRes output signal that drives a pulse generator 113. The pulse generator 113 is then coupled to the Reset signal 123 of the comparator 101. The comparator 101 is further configured to clear the Rdy output signal 122 based on the Reset signal 123. The Rdy output signal 122 is cleared in order to insure that the data signal Q 121 is not read during the transient time when the comparator is settling after or during a reset and a corresponding update of the feedback value.

The Rdy signal 122 is a digital signal that indicates that the comparator has settled and the data signal Q 121 can be reliably read. This determination for the Rdy signal 122 indicates that the comparison between the input signal Vin 124 and the feedback signal generated by the DAC 110 has reached a stable state. In response to the Rdy signal 122 indicating that the comparator 101 is ready and the comparator output is ready to be read, the control block 112 contains logic that then sends control signals to the counter 111 causing the counter to count. Then, the control block 112 causes the reset generator 113 to generate a reset pulse to reset the comparator 101. Subsequently, there are transient conditions as the comparator output values Q 121 and Rdy 122 are reset. At the same time there are also transient conditions while the counter increments or decrements the counter, which cause the digital control register value Dout 125 to be updated. The change in the digital control register value Dout 125 then causes the DAC 110 to produce an updated analog output based on Dout 125 that then affects Vcmp 120. Subsequently, the comparator 101 adjusts to the updated Iout feedback signal and possible changes in the Vin input signal in order to calculate the data output Q 121 for the next clock cycle. Finally, when the comparator 101 determines that the comparator has settled and the data output Q 121 can be read, the Rdy signal 122 is set, and the next cycle begins.

In general, the counter 111 can be of various types such as a binary counter, a Gray coded counter or a thermometer-coded counter. However, the performance of the tracking ADC described in this application can be even further improved by associated design choices in the digital register or counter unit and the DAC that further take advantage of the self-controlled clocking of the ADC.

When counting in single steps of one LSB using a standard binary code, more than one bit must be changed for every other step. In particular, for single LSB counting with a normal binary code, an increment or decrement step of one LSB requires that all bits to the right of the leftmost bit that are changed are set to the inverse value as that of the leftmost bit that is changed. For example, when using a 2-bit binary value (e.g. the binary sequence 00, 01, 10, 11) to count sequentially by steps of one LSB, at least every other counting step requires the changing of at least two bits, e.g. from 01 to 10. In contrast, the use of a Gray code, also known as reflected binary code, eliminates the changing of more than one bit for counting increments of one LSB. With a Gray code, each bit representation is specially designed so that a change of one LSB results in the changing of only one bit. For example, the 2-bit sequence 00, 01, 11, 10 is a valid Gray code sequence as only one bit is changed for each counting step of one LSB. Thus, the use of a Gray code reduces the number of bits that change in value when counting in single steps. This reduction in the number of circuit elements that must change state helps reduce transient effects in the time following a single counting step. A further reduction in the number of circuit elements that must change can be achieved through the use of a thermometer coded counter register, which will be described later in relation to FIG. 5.

The ADC of FIG. 1 may also comprise an input control component 114 that may convert or control the input signal before the comparator stage. For example, the input control component 114 shown in FIG. 1 is a V/I-converter 114 that converts the input voltage Vin 124 to a current in order to generate Vcmp 120 in conjunction with the current source in the I-DAC 110. Thus, the input of the input control component 114 is coupled to the analog input signal Vin 124, and the output of the input control component 114 is coupled to the comparator 101 and to the I-DAC 110 output. The resulting Vcmp 120 is further evaluated by the comparator to generate data signal Q 121 and Rdy output signal 122. The input control component 114 may be further configured to provide conditioning of the analog input signal and/or the analog feedback signal via frequency filtering or the like.

A stewing of the DAC, especially if it does not settle completely in consecutive steps of comparator comparison cycles, can behave like a dead time. Therefore, the loop comprising the self-clocked comparator, the control logic, the digital register, the DAC and the summation node at the input of the comparator may require stabilization by a so called dominant pole. There are several possibilities to ensure stability of the loop and provide stabilization of the feedback loop via a dominant pole. One solution to ensure a dominant pole can be realized by adjusting the low pass filter characteristics at the summation point at the input of the comparator. Other possibilities for feedback loop stabilization include digital filtering of the signals of the comparator; digital filtering of the characteristics (increase or decrease characteristics) of the digital filter representing the D/A converted value, or digital filtering of the input to the DAC.

Furthermore, additional digital filtering may be beneficial to provide digital signal filtering of the comparison signal to reduce the monotonic error, provide feedback stabilization and/or initiate the fast-tracking mode. Possibilities include frequency filtering, predictive filtering or FIR-filtering.

FIG. 2 shows the timing diagram for the tracking ADC of FIG. 1, where the input signal Vin 220 starts at a smaller value and then changes almost instantaneously to a larger value. The dotted vertical lines 201 to 211 represent the clocking cycles of the ADC. As can be seen from FIG. 2, the clocking cycles do not occur at regular intervals. Rather, the clocking intervals are irregular, as the ADC operates under a self-controlled variable clock. For example, clock cycles 202, 203 and 204 are spaced at longer intervals of time and correspond to a smaller difference signal Vcmp 221, representing the difference between the input and feedback signals. Clock cycles 205, 206 and 207 are spaced at shorter intervals of time and correspond to a larger difference Vcmp 221. Referring to FIG. 1, the counter 111 Clk input signal is here assumed to be equivalent with the comparator Rdy 122 output, and the counter Up/Down input signal is assumed to be equivalent with the comparator Q 121 output. Further note that the Rdy signal 223 only occurs when Q 224 has reached a clearly defined high or low level. If the Rdy (Clk) 223 signal were to change to a high level while the Q (Up/Down) 224 signal is still changing its level and/or is at an intermediate value, it could introduce false measurements or errors into the ADC result.

At the time of the first clock cycle in FIG. 2, the digital output signal Dout 225 is low. As Dout 225 rises during cycles 201, 202 and 203, the difference between the input signal and the reference (or feedback) output decreases. This relationship is reflected by the comparator input Vcmp 221 that decreases accordingly. At the comparator, Vcmp 221 is compared to a fixed reference signal. If the difference between the input signals of the comparator decreases, the settling time of the comparator increases. This characteristic can be seen in the increasing intervals between the Rdy (Clk) signals 223 that drive the ADC. Note that the comparator Res pulse 222 is triggered by the Rdy signal 223 and is of constant length. This constant length Res pulse 222 can be, for example, generated by a monoflop. Furthermore, when the input makes a near-instantaneous step change at clock cycle 204, the difference at the input of the comparator becomes larger again as Vcmp 221 increases accordingly. In response, the settling time of the comparator decreases, so the next Rdy (Clk) pulse 223 occurs within a shorter period of time. This dynamic clocking of the ADC allows the digital output signal Dout 225 to more quickly follow the input Vin 220. Thus, the clock rate becomes higher when the comparator input difference is large, which allows the clock rate to be increased during slewing.

FIG. 3 shows a circuit diagram of a possible realization of the track-and-latch stage associated with the comparator of FIG. 1. The circuit has a pre-amplifier stage comprising a differential amplifier 330. The outputs of the differential amplifier 330 are coupled to a plurality of transistors configured to provide a latch output stage comprising both a normal data output (Q) 321 and an inverted signal (Q¬) 322. The ready indicator may further be generated in a straightforward manner by the XOR catenation of Q 321 and Q¬ 322, because in the reset phase Q 321 and Q¬ 322 have the same logic level.

The timing diagram of FIG. 2 shows a constant reset time essentially limiting the maximum clock rate during slewing. Further improvement of the clock rate can be achieved by use of multiple comparators operated in an interleaved mode. FIG. 4 shows such a configuration of an embodiment with a tracking ADC with two comparators 401, 402 operating in interleaved mode. This configuration allows for switching between the two comparators 401, 402, so that during the time when a first comparator 401 is resetting, a second comparator 402 is ready to operate and provide valid data signals, $2^{nd}$ data signal Q 431 and $2^{nd}$ ready signal Rdy 432. Then after the output of the second comparator 402 is read, the second comparator 402 is reset and the first comparator 401 provides the next comparison using $1^{st}$ data signal Q 421 and $1^{st}$ Rdy signal 422. Control logic 412 may include a state machine, in the simplest case a flip-flop, where the control logic 412 is used to control the modes of the two comparators 401, 402 and to select the proper clock and data signal from the multiple comparator outputs.

If multiple comparators are used in interleaved mode the characteristics of the feedback may suffer from different offset characteristics of the different comparators used together in interleaved mode, as the offset characteristics of the different comparators may not be precisely calibrated with each other. For instance, if the input signal is stable and the comparators have different offset characteristics, one comparator may indicate that the input signal is larger than the feedback, while the other indicates that it is lower. As a result, the digital register can increase and decrease periodically, but the average value of the digital register representing the converted output is constant. Such a behavior is like noise. By introducing a kind of digital filtering between the outputs of the comparators and the input to the digital register, for instance a digital low pass finite impulse response filter (FIR), noise and settling characteristics of the ADC can be improved. Thus, when the comparators are operated in interleaved mode, FIR-filtering may be especially beneficial to improve the transfer characteristics of the ADC.

As described above, when the tracking ADC is clocked with a self-controlled variable clock, the clock rate is limited by the settling time of the comparator and the settling time of the feedback DAC as well as some additional time for the digital control logic. If the settling of the DAC is not completed at the end of the reset phase of the comparator, the comparator can provide a false output value, resulting in non-monotony or missing codes. Based on these parameters, the settling time of the feedback DAC can be minimized by the choice of particular DAC unit elements. In this respect, in a further embodiment the digital register counter of the ADC may comprise a thermometer coded digital register to minimize the number of changes that occur in the feedback loop when counting by single LSBs steps.

Thus, FIG. 5 shows a circuit diagram of a tracking ADC with a thermometer coded counter register 511. In contrast to a binary register such as the counter 111 of FIG. 1, which provides an output signal Dout 125 that comprises n binary weighted bits, (i.e. $D_{n-1} \ldots D_0$), the output signal 525 of the thermometer coded digital register 511 comprises $2^n$ LSB weighted bits. This difference allows the circuits for the digital conversion of the DAC 510 to be simpler as well as allowing the DAC 510 to provide a more consistent analog signal. For example, the DAC 110 of FIG. 1 that converts the binary value of Dout 125 to an analog value must have the capability to convert steps of 1×, 2×, 4×, 8×LSBs, etc., where it may be difficult to construct the DAC to ensure that the 8× signal is precisely eight times larger than the 1× signal, the 4× signal exactly twice the 2× signal and four times the 1× signal, etc. Also the DAC may require a relatively large settling time if the output is switched by a magnitude on the order of the most significant bit (MSB). For instance, if the DAC has N bits and the output switches from $2^{(N-1)}-1$ to $2^{(N-1)}$, the time for the DAC to update its output value completely may be very long. In contrast, the DAC 510 of FIG. 5 can use virtually the same configuration for each bit. This allows the generation of a more consistent analog signal. For example, the counter 511 could be built from $2^N$ flip-flops each connected in a similar manner to current sources. Thus, if the current conversion is affected by temperature or other error factors, each bit will be similarly affected, so the overall effect is less significant.

The use of a thermometer coded DAC as in FIG. 5 allows the effect of the settling time of the feedback DAC on the ADC measurement to be decreased. In particular, when a thermometer coded DAC is used, an incomplete settling of the DAC during slewing of the tracking ADC may increase the tracking error. However, this error does not result in non-monotony, which is a substantial improvement, particularly concerning reliability.

A possible realization of the thermometer coded counter register 511 of FIG. 5 is shown in FIG. 6, where the counter consists of a chain of D-flip-flops 601, 602, 603, 604 and so on. These flip-flops 601, 602, 603, 604 are filled from the left side with ones if a clock signal is applied and the up/down-input is high. The flip-flops 601, 602, 603, 604 are filled from the right side with zeroes if a clock is applied and the up/down-input is low. Note that for simplicity the D flip-flops in FIG. 6 are shown as basic D flip-flops. In an actual realization of the circuit, master-slave pulse-triggered D flip-flops would likely be used instead by connecting two gated D latches in series in order to enable pulse-triggering on the rising edge of the clock pulse and enable change of the output on the falling edge of the clock pulse.

A thermometer coded counter register avoids conversion errors by eliminating intermediary transition states that could result in transient values and an incorrect feedback signal. For example, a thermometer coded DAC may generate small errors within the order of a LSB, but these errors are insignificant compared to the errors from a binary register. For example, consider the case where a binary register increments from binary value 0111 to 1000; as every bit must change state, the register could easily provide a false value of 1111 or 0000, depending on whether the bits are set or cleared more quickly. Thus, in this case, the error of the binary register could be as high as 100%. Because a thermometer coded DAC may generate small errors but does not generate substantially wrong outputs during the input data settling and decoding period, the settling characteristics of the DAC place virtually no limit on the clock rate of the tracking ADC. Thus, the primary limiting factors for the ADC with a thermometer coded counter register are the reset time of the comparator and the settling time of the comparator.

To decrease the maximum tracking time in response to large changes in the input signal, a further embodiment provides a fast tracking mode where the counter can count up and down in either small or large increments or decrements. FIG. 7 shows a circuit diagram of a tracking ADC according to the invention including a fast tracking mode.

In addition to the comparator 701 as in the embodiments of FIG. 1 and FIG. 5, the ADC of FIG. 7 further comprises two additional comparators 702 and 703. Comparator 702 is coupled to a high-level reference voltage Vhigh 712, and comparator 703 is coupled to a low-level reference voltage Vlow 713. The outputs of the high and low comparators 712, 713 are connected to control logic 704, which provides a fast output signal 705. The counter 711 further comprises a fast input that is connected to the output signal 705 from the fast control logic 704, which indicates that the counter 711 should increment or decrement the counter register value in larger steps.

If there is a large difference between the I-DAC output current and the input current, the comparator input voltage Vcmp 720 deviates far from the reference voltage Vref. If Vcmp 720 exceeds Vhigh 712 or falls below Vlow 713, the respective comparators 702, 703 corresponding to the Vhigh 712 and Vlow 713 cause the corresponding comparator output to switch to high. As these comparator signals are OR-connected in the control logic 704, the fast output signal 705 becomes high if either of the comparators 712, 713 indicates that Vcmp 720 deviates substantially from the feedback voltage Vref. Finally, the counter 711 is configured to count in larger steps when the fast output signal 705 is high, which allows the ADC to more quickly adjust to large changes in the input signal Vin. The counter 711 can be configured with different values for large and small steps. For example, in the simplest case, a small step may be 1 LSB and a large step 2 LSBs. The size of the large step can be further increased to provide even faster adjustment to input changes. However, if the size of the large step is made too large relative to the voltage levels Vhigh 712 and Vlow 713, there may be some overshoot of the ADC output value.

Furthermore, for a comparator, the determination of a large input difference is simple and straightforward, while differentiating between signals with a small difference may require complex and expensive comparators in order to provide the sensitivity necessary to properly and reliably detect small differences. Furthermore, it is also more difficult to design comparators with fast reaction times for measuring small differences, whereas this aspect is less problematic with large signal differences. These considerations allow for additional design benefits concerning the additional comparators 702 and 703. As the primary comparator 701 performs the relevant comparison when the signal difference is small, and the outputs of the additional comparators 702 and 703 are only relevant for large differences, the additional comparators 702 and 703 need not provide precise measurements or have fast response times for small differences. Hence, these additional comparators 702 and 703 may be simple and inexpensive. Furthermore, the comparators need not have special characteristics regarding offset and response time, as they are only relevant for determining if a switch should be made to fast mode when a large difference is present. These considerations allow for the addition of the fast-tracking mode with relatively little cost or additional complexity, as very basic comparators can be used.

Furthermore, because the fast-tracking mode is realized with only one summation point in the control logic 704, the design makes it relatively simple to achieve stability by one dominant pole realized by the parasitic capacitance at the summation point connected to the input (and hence the input capacitances) of the comparators.

Alternately, a fast-tracking mode could also be implemented through the use of digital filtering of the comparison output signal. For example, if a series of multiple high signals is detected, the control logic could then cause the digital register to count in fast mode.

FIG. 8 shows a detailed timing diagram for a circuit simulation of the tracking ADC of FIG. 1, where the input signal 801 is a square wave. The variable rate of the clock signal can be seen particularly well from the variable period of both the analog value of the comparator output 803 and the reset pulse Res 804. Furthermore, during periods of slewing of the digital output Dout 805, the clock rate is very high, whereas during periods of little change the clock rate is low.

FIG. 9 shows the timing diagram for a circuit simulation for the tracking ADC of FIG. 1, where the input signal 901 is a sinusoidal wave. Likewise, the variable rate of the clock can be seen in the comparator internal analog signal 903, the comparator digital signal 904, the reset signal 905 and the DAC output 906.

The techniques described in this patent application to use a comparator data ready indicator in order to clock a tracking ADC with a self-controlled variable clock could be applied by a person skilled in the art to other types of ADCs. Furthermore, tracking ADCs with self-controlled variable clocks based on the teachings of this application should be appropriate for usage in a wide range of devices, such as audio sampling or digital-controlled switched mode power supplies. The specific embodiments described herein are only intended to be teaching examples, which a person skilled in the art would then adapt for a specific design purpose.

Although the techniques described herein have been illustrated with specific examples, in which the comparisons are performed based on voltages, these techniques should not be limited to these examples or embodiments as the techniques can be equally applied to a situation where the comparisons are based on currents or charges. The features that allow for tracking of the ADC with a self-controlled variable clock apply equally as well to currents or charges, using for example current mirrors or capacitors.

It should be noted that the description and drawings merely illustrate the principles of the proposed devices and methods. It will thus be appreciated that those skilled in the art will be able to devise various arrangements that, although not explicitly described or shown herein, embody the principles of the proposed devices and methods and are considered to be part of the disclosure of this document. Furthermore, all statements herein reciting principles, aspects, and embodiments of the proposed methods and devices, as well as specific examples thereof, are intended to encompass equivalents thereof.

Finally, all examples recited herein are principally intended expressly to be only for pedagogical purposes to aid the reader in understanding the principles of the proposed methods and devices and the concepts contributed by the inventors to furthering the art, and are to be construed as being without limitation to such specifically recited examples and conditions.

Furthermore, it should be noted that any circuit diagrams or block diagrams herein represent conceptual views of illustrative devices embodying the principles of the invention. Similarly, it will be appreciated that any control logic, state machines, state transition diagrams, and the like represent various processes which may be substantially represented in computer readable medium and so executed by a computer or processor, whether or not such computer or processor is explicitly shown.

What is claimed is:

1. A tracking analog-to-digital converter "ADC" with a self-controlled variable clock, comprising:
 a digital register;
 a digital-to-analog converter "DAC" coupled to said digital register and providing an analog feedback signal;
 a comparator providing a comparison signal based on a comparison between an analog input signal and said analog feedback signal, said comparison signal being coupled to the digital register;
 a means for determining a comparison ready indicator based on a determination of comparator readiness, indicating said comparator is ready, further indicating said comparison signal can be reliably read;
 a means for clocking to generate a clock signal to control said digital register in response to at least said comparison ready indicator indicating said comparator is ready; and
 said digital register being configured to increase or decrease a value of the digital register in response to said clock signal based on said comparison signal of the comparator.

2. The ADC of claim 1, wherein said means for determining comparator readiness comprises said determining of said comparison ready indicator based on a state of readiness of said comparator, said comparator being determined to be ready when the comparator has settled.

3. The ADC of claim 1 further comprising:
 a means for resetting the comparator to reset the comparator and cause said comparison ready indicator of the comparator to be reset, said means for resetting the comparator being dependent on at least said comparison ready indicator.

4. The ADC of claim 1 further comprising:
 a control block coupled to at least said comparator and said digital register, said control block configured to generate signals to control said digital register based on at least said comparison ready indicator and said comparison signal.

5. The ADC of claim 1 further comprising:
 a means for delaying based on a determination of a comparator settling time, said determination of comparator readiness, a determination of a settling time of said DAC and/or a maximum clock rate of said digital register;
 said means for delaying further comprising:
 a means for delaying said clock signal for said digital register,
 a means for delaying the start of a reset pulse generated by the means for resetting the comparator, and/or
 a means for extending the duration of a reset pulse generated by the means for resetting the comparator.

6. The ADC of claim 1,
 wherein said digital register is an up-down counter, the inputs of said counter comprising an up/down input selector and a clock input signal,
 wherein said up/down input selector indicates whether said digital register should increment or decrement its value based on said comparison signal,
 wherein said clock input signal is coupled to said means for clocking.

7. The ADC of claim 1, wherein
 said comparator further comprising a latch output stage comprising a comparison output signal and an inverted comparison output signal;
 said means for determining comparator readiness further configured to generate said comparison ready indicator based on the latched comparison signals.

8. The ADC of claim 1, wherein
 said means for determining comparator readiness further comprising determining said comparison indicator signal based on sensing of analog signals inside the comparator.

9. The ADC of claim 1,
 wherein said digital register is configured to update an output value of the digital register by modifying a single bit of said output value of said digital register in response to an increment or decrement step of one least significant bit "LSB" of said value of the digital register.

10. The ADC of claim 1,
 wherein said digital register is configured to update an output value of the digital register in response to an increment or decrement step by modifying said value of the digital register, by either:
 setting one or more bits without clearing any bits for each increment step and clearing one or more bits without setting any bits for each decrement step, or
 clearing one or more bits without setting any bits for each increment step and setting one or more bits without clearing any bits for each decrement step.

11. The ADC of claim 1,
 wherein said DAC is further configured to produce a monotone change in said analog feedback signal in response to any increment or decrement step of one LSB of said output value of said digital register.

12. The ADC of claim 1,
 wherein said DAC is further configured to produce a monotone change in said analog feedback signal during its time of settling in response to any increment or decrement steps.

13. The ADC of claim 1,
 wherein the digital register comprises a thermometer coded counter register or a Gray coded counter.

14. The ADC of claim 1,
 wherein said digital register comprises a plurality of storage elements, said DAC comprises a plurality of D/A conversion elements, each storage element being configured to control one conversion element of said DAC.

15. The ADC of claim 1,
 wherein said digital register comprises a plurality of storage elements, each storage element being configured to control at least one conversion element of said DAC,
 wherein any change in an output signal level of any one of said plurality of storage elements from "low" to "high" induces a direct change in said DAC output value representing physical value in one and the same direction, and
 wherein any change in an output signal level of any one of said plurality of storage elements from "high" to "low" induces a direct change in said DAC output value representing physical value in the opposite direction.

16. The ADC of claim 1,
 wherein said comparator comprises a current comparator, a voltage comparator or a charge comparator.

17. The ADC of claim 1, further configured to increase the tracking speed by employing additional comparators in interleaved mode, the ADC further comprising:

one or more additional comparators operating in interleaved mode, each coupled to said analog input signal and said analog feedback signal and each providing comparison signals based on a comparison between said analog input signal and said analog feedback signal, wherein the one or more comparison signals of each additional comparator are coupled to inputs of said control block;

an additional means for determining comparator readiness for each of the one or more additional comparators, to determine if the respective additional comparator is ready, indicating the respective comparison signal can be reliably read; and a means for selecting a comparator to alternately select one of the plurality of comparators from the plurality of comparators to be used for said means for clocking to drive said digital register.

18. The ADC of claim 17, wherein said means for selecting a comparator comprises:
a control logic to control comparator selection to alternately select a comparator from the plurality of comparators, select the corresponding comparison signal of the selected comparator and reset the selected comparator.

19. The ADC of claim 1, further comprising:

a means for providing a fast-tracking mode to increase or decrease said value of said digital register in either small or large steps.

20. The ADC of claim 19, wherein said means for providing fast-tracking mode comprises:

one or more additional comparators each associated with a corresponding difference level signal;

each of the one or more additional comparators configured to determine a corresponding large difference signal by comparing a difference between said analog input signal and said feedback signal with the corresponding difference level signal associated with each additional comparator;

said digital register further comprising:
one or more fast count inputs, configured to cause said digital register to count in larger increments or decrements based on conditions where any of the large difference signals of said one or more additional comparators indicate the difference between said analog input signal and said feedback signal is larger than a corresponding difference level signal.

21. The ADC of claim 1, further comprising:

a means for providing digital signal filtering of said comparison signal.

22. The ADC of claim 1, further comprising:

a means for adding a dominant pole to the feedback loop comprising said comparator, said control logic, said digital register and said DAC.

23. The ADC of claim 1, further comprising:

a means for clocking the ADC based on an external clock in order to synchronize the self-controlled variable clock with said external clock.

24. A method of clocking a tracking analog-to-digital converter "ADC" with a self-controlled variable clock, the method comprising:

receiving an analog input signal;

obtaining a digital counter signal from a digital register;

obtaining an analog feedback signal from a digital-to-analog converter "DAC" based on said digital counter signal;

comparing, by a comparator, said analog input signal with said analog feedback signal to determine a comparison signal, indicating whether the analog input signal is larger or smaller than said analog feedback signal;

determining a comparison ready indicator for the comparator based on a determination of whether said comparator has settled, indicating whether said comparison signal of the comparator can be reliably read;

indicating, in response to a change in said comparison ready indicator, that the comparator has settled and said comparison signal of the comparator can be reliably read:

increasing or decreasing a value of said digital register based on said comparison signal and said comparison ready indicator from said comparator.

25. The method of claim 24, wherein a maximum clock rate is primarily limited by a settling time of comparator.

26. The method of claim 24, wherein a clock rate is allowed to be substantially increased in response to large input changes.

27. The method of claim 24, wherein shorter tracking times in response to large input changes are provided.

28. The method of claim 24, wherein a clock rate is dynamically increased during the time period when the digital output is slewing.

29. The method of claim 24, wherein the comparison ready indicator of the comparator is caused to be reset in response to a change in the comparison ready indicator, indicating that the comparator has settled and the comparison signal of the comparator can be reliably read.

30. The method of claim 24, wherein a step of counting the digital register is delayed based on a determination of a settling time of the digital register, a determination of a settling time of the DAC and/or the maximum clock rate of the digital register.

31. The method of claim 24, wherein the comparison ready indicator is determined from a latch output stage of the comparator comprising a latched comparison signal and an inverted latched comparison signal.

* * * * *